(12) United States Patent
Khoche

(10) Patent No.: US 6,842,022 B2
(45) Date of Patent: Jan. 11, 2005

(54) SYSTEM AND METHOD FOR HETEROGENEOUS MULTI-SITE TESTING

(75) Inventor: Ajay Khoche, Cupertino, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/252,863

(22) Filed: Sep. 20, 2002

(65) Prior Publication Data

US 2004/0059972 A1 Mar. 25, 2004

(51) Int. Cl.$^7$ ............................................. G01R 31/02
(52) U.S. Cl. ..................... 324/754; 324/158.1; 324/765
(58) Field of Search ................. 324/754, 765, 324/158.1, 72.5, 758, 763; 714/719, 720, 724, 119; 365/201; 438/14, 17–19; 254/48

(56) References Cited

U.S. PATENT DOCUMENTS

| | | | |
|---|---|---|---|
| 5,504,369 A | | 4/1996 | Dasse et al. |
| 5,506,851 A | * | 4/1996 | Fuse ........................... 714/724 |
| 5,682,472 A | * | 10/1997 | Brehm et al. .................. 714/25 |
| 5,748,124 A | * | 5/1998 | Rosenthal et al. .......... 341/120 |
| 5,896,040 A | | 4/1999 | Brannigan et al. |
| 5,898,186 A | | 4/1999 | Farnworth et al. |
| 6,061,814 A | * | 5/2000 | Sugasawara et al. ........ 714/724 |
| 6,134,685 A | | 10/2000 | Spano |
| 6,275,051 B1 | | 8/2001 | Bachelder et al. |
| 6,331,770 B1 | * | 12/2001 | Sugamori ................. 324/158.1 |
| 6,340,823 B1 | | 1/2002 | Kitade |
| 6,426,904 B2 | | 7/2002 | Barth et al. |
| 6,476,628 B1 | * | 11/2002 | LeColst ....................... 324/765 |
| 6,536,006 B1 | * | 3/2003 | Sugamori .................... 714/724 |
| 6,557,128 B1 | * | 4/2003 | Turnquist .................... 714/724 |

OTHER PUBLICATIONS

U.S. Appl. No. 10/155,651, filed May 24, 2002, Volkerink et al.

* cited by examiner

*Primary Examiner*—Michael Tokar
*Assistant Examiner*—Jimmy Nguyen

(57) ABSTRACT

Disclosed are systems and methods which implement multi-site testing in which a test sequence implemented with respect to dice of a set of dice for parallel testing is not identical. Accordingly, heterogeneous test sequences are employed with respect to dice tested in parallel. A sequence of tests for testing individual circuit blocks of dice may be selected for optimizing the time for testing the set of dice for which parallel testing is conducted. Additionally or alternatively, a sequence of tests for testing individual circuit blocks of dice may be selected for managing and/or reducing the resources utilized in testing the dice. Moreover, test sequences may be dynamically determined for the dice of a set of dice being tested in parallel, such as in response to feedback provided by sensors monitoring the dice, to address various side effects.

24 Claims, 4 Drawing Sheets

SYSTEM AND METHOD FOR HETEROGENEOUS MULTI-SITE TESTING

CROSS-REFERENCE TO RELATED APPLICATIONS

The present application is related to co-pending and commonly owned U.S. patent application Ser. No. 10/155,651 entitled "System and Method for Testing Circuitry on a Wafer," filed May 24, 2002, the disclosure of which is hereby incorporated herein by reference.

TECHNICAL FIELD

The present invention relates in general to testing of circuitry on a semiconductor wafer and, more particularly, to heterogeneous multi-site testing of integrated circuitry.

BACKGROUND OF THE INVENTION

During typical semiconductor manufacturing processes, a plurality of integrated circuits are formed as individual dice on a semiconductor wafer. Each semiconductor wafer generally has hundreds to thousands of individual dice formed thereon. Each dice, particularly those providing system-on-chip (SoC) or application specific integrated circuits (ASIC), may include a plurality of blocks, such as to provide different functionality. For example, each dice may include one or more blocks of circuitry for providing digital processing as well as one or more blocks of circuitry for providing analog or radio frequency (RF) processing.

Once the dice are formed on a semiconductor wafer, the dice are then tested to determine which dice are functional and which dice are not functional (this procedure is sometimes referred to as "wafer sort"). The purpose of the wafer-level probe test is to determine, as early as possible in the manufacturing process, whether each individual die is defective or not. The earlier a defective die is detected, the less time and expense that is wasted on further processing of defective dice. That is, if it is determined that a detected defect cannot be repaired, the time and expense of completing a chip assembly will not be expended.

In most testing procedures, each die or device under test (DUT) is probed using very costly probe equipment while the dice are still on the wafer. In traditional testing procedures, probe equipment is used to contact each bonding pad (or "access pad") on an individual die with a separate probe needle or pin. More specifically, in traditional testing procedures, each die or discrete block of circuitry thereof (circuitry under test (CUT)) is probed in order to determine whether it passes a very basic test (e.g., a test for electrical opens or electrical shorts). In most cases, a full functional test may also be performed using the probe equipment. A probe (which may also be referred to as a "stylus") may be brought into contact with one or more bonding pads of a die in order to communicate signals (e.g., a test pattern) to the die and to receive the signals output by the die responsive to the input signals. The probe may be communicatively coupled to automated test equipment (ATE) that is operable to generate the signals to be input to a die and to evaluate the signals output by the die in order to determine whether the die is functioning properly.

Traditional testing procedures generally involve contacting access pad(s) of each individual die with a probe in series. That is, the dice of a wafer are generally tested one at a time in series using a probe to contact the pad(s) of each die. However, traditional testing procedures are problematic because of their serial nature. For example, using a probe to test one die after another die results in an undesirably long time being required for testing all of the dice of a wafer, which effectively increases the overall cost of testing the dice. Probes, and their attendant resources, used for testing the dice are generally very expensive, and it is therefore undesirable to have a probe tied up for a long time testing the dice of a single wafer.

Further, the life of a probe is generally measured by the number of times it touches down on dice (e.g., a probe may have a typical life of one million touch downs). Traditional testing procedures that require a probe to touch down on one (or a few) dice at a time effectively increases the wear of a probe. For instance, a probe having a life of one million touch downs that is utilized in a traditional testing procedure in which one die at a time is tested will be capable of testing one million dice. Considering the cost associated with such probes, it is generally desirable to effectively prolong the life of a probe by testing as many dice as possible during the probe's life. Moreover, single (or a few) dice testing requires longer testing times as the probe must be moved to a die and conduct the appropriate testing, move to another die and conduct the appropriate testing, etcetera.

From the above, it can appreciated that it is generally desirable to test a number of dice in parallel. Accordingly, more recently, testing techniques have been proposed that enable parallel testing of multiple dice of a wafer with a single probe. Examples of such parallel testing schemes that have been proposed include those described in U.S. Pat. No. 6,426,904 entitled "Structures for Wafer Level Test and Burn-In" issued Jul. 30, 2002 to Barth, et al., U.S. Pat. No. 6,275,051 entitled "Segmented Architecture for Wafer Test and Burn-In" issued Aug. 14, 2001 to Bachelder, et al., U.S. Pat. No. 6,134,685 entitled "Package Parallel Test Method and Apparatus" issued Oct. 17, 2000 to Spano, and U.S. Pat. No. 5,896,040 entitled "Configurable Probe Pads to Facilitate Parallel Testing of Integrated Circuit Devices" issued Apr. 20, 1999 to Brannigan, et al., the disclosures of which are hereby incorporated herein by reference.

In providing a parallel testing implementation, a probe may comprise a sufficient number of pins to enable access pads of multiple dice to be contacted simultaneously for testing of such multiple dice and the ATE associated therewith may comprise a number of resources, such as test signal generators and output signal analyzers, to enable testing of multiple dice simultaneously. In implementing such parallel testing, a test sequence is typically established for testing the discrete blocks or CUTs of the dice or DUTs, and this same static test sequence is employed with respect to each die of the wafer.

Discrete blocks or CUTs of the dice or DUTs may be analyzed to determine which blocks may be tested in parallel (e.g., digital blocks) and which blocks may not be suitable for parallel testing (e.g., analog blocks, such as due to radio frequency (RF) mutual interference, due to lack of ATE resources, etcetera). Using such information, parallel testing according to the prior art is implemented to employ the aforementioned test sequence with respect to each die of a set of dice being tested in parallel such that only those blocks compatible with parallel testing are tested simultaneously in parallel and those blocks incompatible with simultaneous parallel testing are tested serially. Accordingly, such prior art solutions, relying upon a same static test sequence for each die of a set of dice being tested, do not achieve maximum parallelism but instead provide an often non-optimized hybrid parallel/serial test technique.

Additionally, while certain probe implementations may provide a sufficient number of pins to enable a plurality of dice to be tested simultaneously, such testing is limited by the resources available at the ATE. For instance, a probe that comprises sufficient pins for contacting two dice simultaneously may be prevented from actually testing the two dice, or blocks thereof, due to a lack of redundancy of a particular resource necessary for testing at the ATE. For example, RF circuitry test apparatus is often very expensive whereas digital test apparatus is relatively inexpensive, resulting in multiple digital test resources being available while only a few or even a single RF test resource is available at the ATE. Accordingly, testing may be limited serial testing due to limitations associated with the available resources, thereby requiring longer test times and preventing certain parallel testing scenarios.

Semiconductor manufacturers spend a significant amount of money packaging defective dice which pass the testing performed during probing, but which do not pass subsequent reliability testing after packaging. The cost saving goal of detecting and screening out defective dice as early as possible in the manufacturing process is especially important in the context of multi-chip modules (MCMs), e.g., the aforementioned SoCs. Multi-chip modules (MCMs) are electronic modules that include a plurality of integrated circuit dice which are packaged together as one unit. Multi-chip modules are becoming more widely used.

For multi-chip modules, it is quite costly to replace one or more failed dice once the dice have been bonded onto a substrate. Therefore, it is desirable to determine whether a die is fully functional and is reliable before the die is packaged as part of a multi-chip module. In addition, many manufacturers of multi-chip modules are requiring that semiconductor manufacturers sell them fully tested "known good dice" that have passed reliability tests and that are not packaged in an integrated circuit package.

BRIEF SUMMARY OF THE INVENTION

An embodiment of the present invention provides a system for testing dice on a wafer comprising automated test equipment having a plurality of test resources, wherein ones of the test resources perform different circuitry tests including a first circuitry test and a second circuitry test, and a probe for placing the plurality of test resources in communication with a set of dice comprising a plurality of dice on said wafer, wherein control circuitry of the automated test equipment performs the first and second circuitry tests in a different order with respect to a first die and a second die of the set of dice.

Further, embodiments of the present invention provide a method for testing blocks of circuitry on a wafer comprising establishing heterogeneous test sequences for use in testing the blocks of circuitry, and testing a plurality of the blocks of circuitry in parallel using the heterogeneous test sequences.

Embodiments of the invention provide a method for testing dice on a wafer comprising establishing a first test sequence for testing circuit blocks of a first die on the wafer, establishing a second test sequence for testing circuit blocks of a second die on the wafer, wherein the first test sequence provides for testing of circuit blocks in a different order than does the second test sequence, and testing the first die using the first test sequence while testing the second die using the second test sequence.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION OF THE INVENTION

Figure 1:
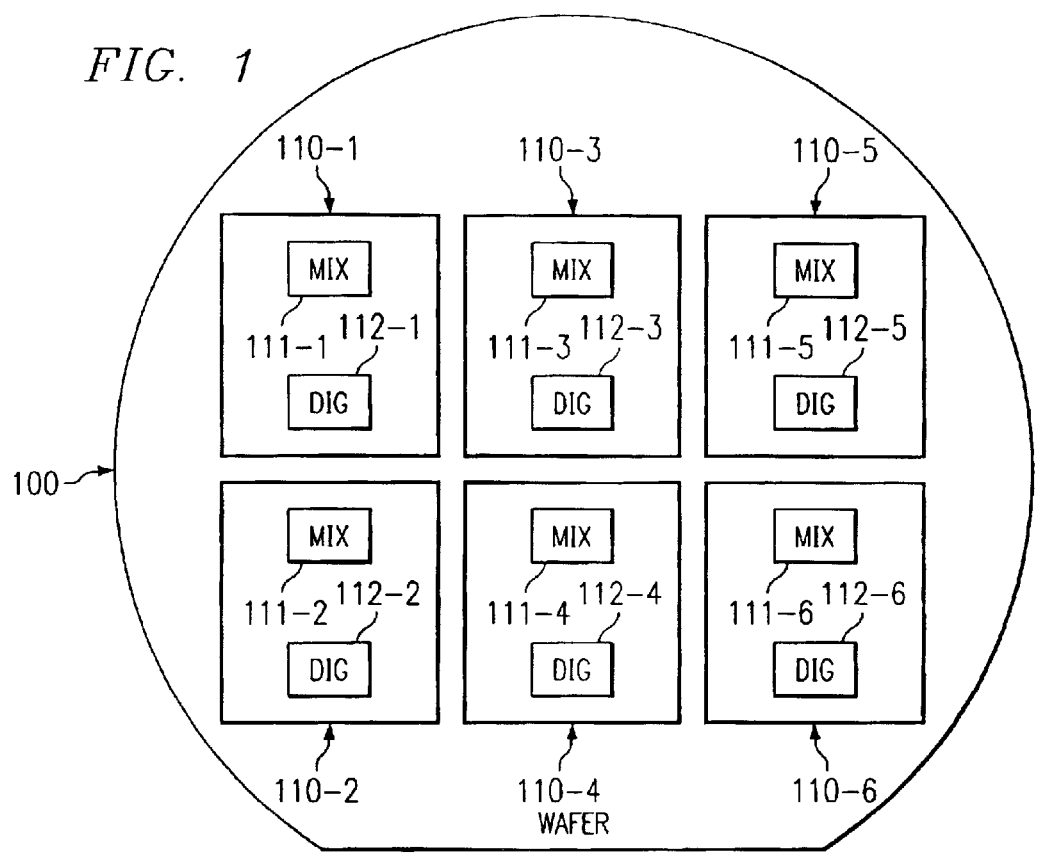
FIG. 1 shows a wafer having multiple dice suitable for parallel testing according to the present invention.

The present invention is directed to systems and methods which implement multi-site testing in which the test sequence implemented with respect to dice of a set of dice for parallel testing is not identical, i.e., heterogeneous test sequences are employed with respect to dice tested in parallel. According to a preferred embodiment, a sequence of tests for testing individual circuit blocks of dice is selected for optimizing the time for testing the set of dice for which parallel testing is conducted. Additionally or alternatively, a sequence of tests for testing individual circuit blocks of dice may be selected for managing and/or reducing the resources utilized in testing the dice.

According to an embodiment of the invention, a test sequence is selected for managing the results of the tests or side effects associated with the testing, such as heat, noise, temperature, power consumption, etcetera. Accordingly, the present invention may dynamically determine the sequence of tests for the dice of a set of dice being tested in parallel, such as in response to feedback provided by sensors monitoring the dice, to address various side effects.

According to preferred embodiments of the present invention, ATE is adapted to provide out of order or heterogeneous execution of a test sequence with respect to one or more dice of a set of dice tested in parallel. Such ATE adaptation may comprise providing instruction sets, such as within an ATE software control program or an ATE read only memory (ROM) etcetera, to implement heterogeneous test sequences according to the present invention as well as to determine heterogeneous test sequences to provide optimized test times with respect to the set of dice. Additionally or alternatively, such instruction sets may operate to determine heterogeneous test sequences to facilitate the efficient use of ATE resources utilized in conducting testing. The aforementioned instruction sets may additionally or alternatively operate to dynamically configure/reconfigure the particular heterogeneous test sequences utilized, such as in response to monitored conditions with respect to the dice being tested.

ATEs of the present invention are preferably adapted to provide sharing of ATE test resources in parallel testing of dice. According to a most preferred embodiment of the present invention, switch matrices or other controllable selection means are utilized to share ATE test resources among the dice tested in parallel according to heterogeneous test sequences of the present invention. ATEs of the present invention also preferably allow selection of different resources dynamically during testing of a set of dice.

It should be appreciated that embodiments of the present invention not only enable optimized parallel multi-site testing, but also enable parallel testing which would not otherwise be possible. Specifically, where ATE resources are limited, and therefore prevent or limit parallel testing, and/or where simultaneous parallel testing of particular dice blocks is not possible, and therefore prevent parallel testing using a homogeneous test sequence, heterogeneous test sequences of the present invention provide parallel testing.

Turning now to FIG. 1, an example of a wafer, shown as wafer 100, is shown having a plurality of dice, shown here as dice 110-1 through 110-6, formed thereon which may be singulated during a singulation process (e.g., and may be packaged as an integrated circuit). The dice in the illustrated example each comprise the same circuitry, although in some manufacturing processes differing circuitry may be included at different dice of a wafer. For example, mixed circuit blocks 111-1 through 111-6 represent a same circuit configuration providing a discrete or separately testable circuit block having both analog (e.g., RF) components and digital components with respect to corresponding ones of dice 110-1 through 110-6. Similarly, digital circuit blocks 112-1 through 112-6 represent a same circuit configuration providing a discrete or separately testable circuit block having only digital components with respect to corresponding ones of dice 110-1 through 110-6. Of course, it should be appreciated that a wafer may include more or less dice than those illustrated and/or more or less circuit blocks may be included with respect to the dice thereof.

Although not shown in FIG. 1, the various dice and/or wafer 100 may include one or more access pads that are communicatively coupled to the circuit blocks for providing test signals thereto and/or for receiving signals output therefrom. These access pads may be contacted by a test probe of an ATE to provide and receive signals from particular devices under test (DUTs) of dice 110-1 through 110-6, in order to test the functionality of circuitry under test (CUT) thereof, e.g., mixed circuit blocks 111 and/or digital circuit blocks 112.

Figure 2A:
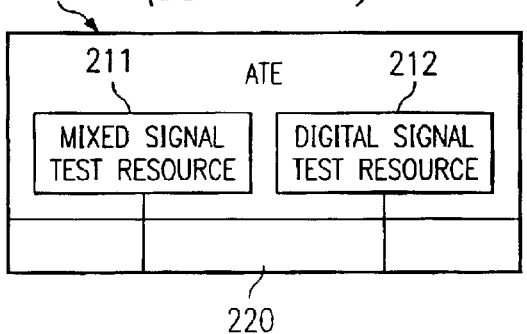
FIG. 2A shows automated test equipment for serial testing according to the prior art.
Figure 2B:
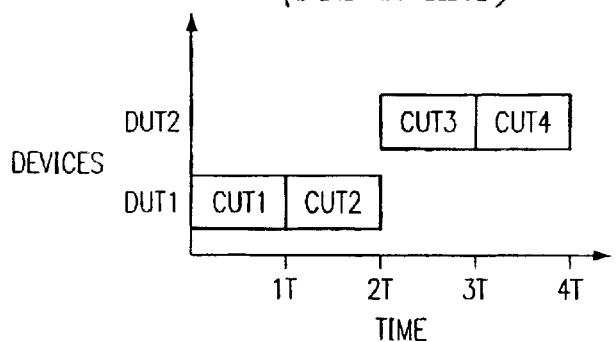
FIG. 2B shows a timing diagram of serial testing using the automated test equipment of FIG. 2A.

For example, in providing for testing of the dice of wafer 100 according to a prior art serial test technique, as shown in FIGS. 2A and 2B, probe section 220 of ATE 200 may comprise a plurality of pins that may be utilized to contact access pads die of 110-1 for testing mixed circuit block 111-1 using mixed signal test resource 211 and for testing digital circuit block 112-1 using digital signal test resource 212. Thereafter, the pins of probe section 220 of ATE 200 may be utilized to contact access pads of die 110-2 for testing mixed circuit block 111-2 using mixed signal test resource 211 and for testing digital circuit block 112-2 using digital signal test resource 212.

A test sequence for the dice of wafer 100 may be determined in which mixed circuit blocks 111 are to be tested first followed by testing of digital circuit blocks 112. According to a prior art serial test technique, die 110-1 (DUT1) may have the aforementioned test sequence performed to test mixed circuit block 111-1 (CUT1) and digital circuit block 112-1 (CUT2), as illustrated in the timing diagram of FIG. 2B. Thereafter, die 110-2 (DUT2) may have the aforementioned test sequence performed to test mixed circuit block 111-2 (CUT3) and digital circuit block 112-2 (CUT4), also as illustrated in the timing diagram of FIG. 2B. Accordingly, where each such CUT requires time T for testing, serial testing of these first 2 dice of wafer 100 according to the prior art requires 4T time.

Figure 3A:
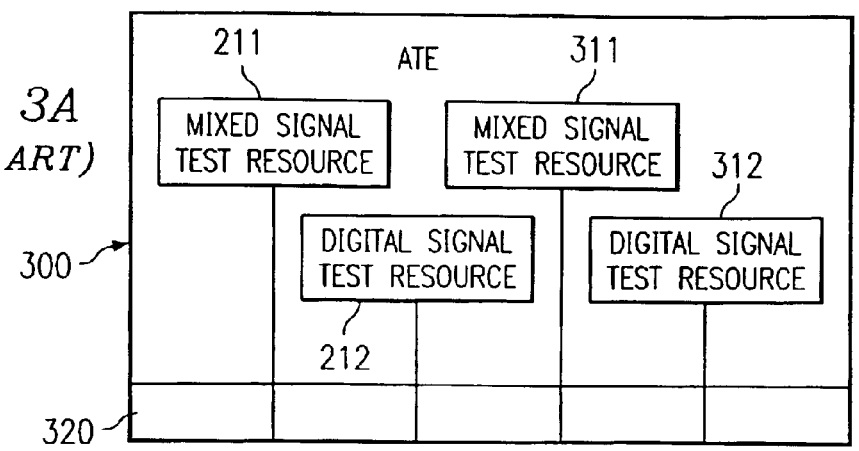
FIG. 3A shows automated test equipment for homogeneous parallel testing according to the prior art.
Figure 3B:
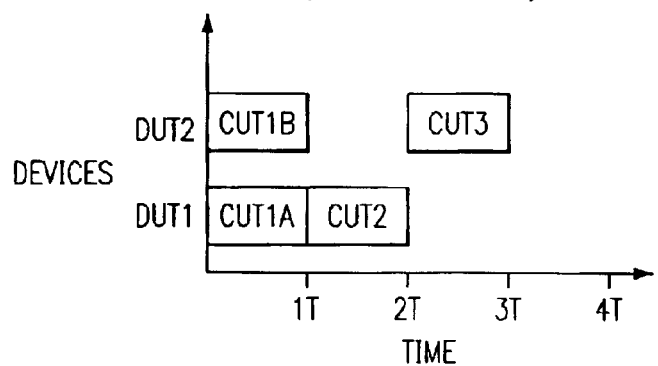
FIG. 3B shows a timing diagram of homogeneous parallel testing using the automated test equipment of FIG. 3A.

More recently, however, testing techniques have been proposed that enable parallel testing of multiple dice of a wafer, at least to some extent. FIGS. 3A and 3B illustrate an example of a parallel testing configuration proposed in the prior art. As with ATE 200 of FIG. 2A, probe section 320 of ATE 300 may comprise a plurality of pins that may be utilized to contact access pads of the dice. However, probe section 320 may comprise a number of pins, and/or a configuration thereof, to provide for parallel testing of die 110-1, using mixed signal test resource 211 and digital signal test resource 212, and die 111-2, using mixed signal test resource 311 and digital signal test resource 312.

In providing for testing of the dice of wafer 100 according to a prior art parallel test technique, it may be determined to test particular circuit blocks are incompatible with simultaneous parallel testing. For example, it may be determined that the RF portions of mixed circuit blocks 111 cause mutual interference such that simultaneous parallel testing thereof is not advisable. Accordingly, a test sequence for the dice of wafer 100 may be determined in which digital circuit blocks 112 are to be tested in parallel first followed by serial testing of mixed circuit blocks 111. For instance, dice 110-1 (DUT 1) and 110-2 (DUT2) may have the aforementioned test sequence performed to test digital circuit blocks 112-1 (CUT1A) and 112-2 (CUT1B) in parallel, as shown in the timing diagram of FIG. 3B. Thereafter, the test sequence may provide serial testing such that mixed circuit block 111-1 (CUT2) of die 110-1 (DUT1) is tested followed by testing of mixed circuit block 111-2 (CUT3) of die 110-2 (DUT2), as illustrated in the timing diagram of FIG. 3B. Accordingly, where each such CUT requires time T for testing, parallel testing of these first 2 dice of wafer 100 according to the prior art requires 3T time.

Figure 3C:
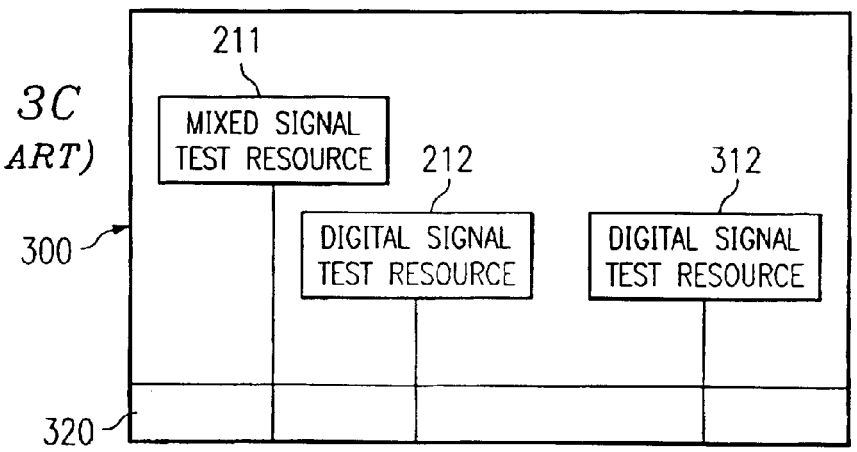
FIG. 3C shows automated test equipment for homogeneous parallel testing according to the prior art.

It should be appreciated that the case illustrated in FIG. 3B may also be associated with a homogeneous testing solution where an ATE resource limitation is incompatible with simutaneous parallel testing of particular circuit blocks. For example, ATE 300 of FIG. 3C has only one mixed signal resource. Accordingly, a test sequence for the dice of wafer 100 may be determined in which digital circuit blocks 112 are to be tested in parallel first followed by serial testing of mixed circuit blocks 111 as shown in FIG. 3B.

Figure 4A:
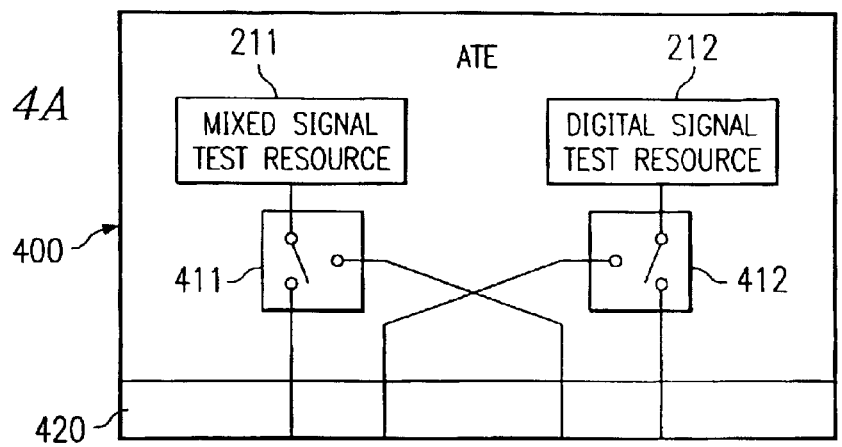
FIG. 4A shows automated test equipment for heterogeneous parallel testing according to the present invention.
Figure 4B:
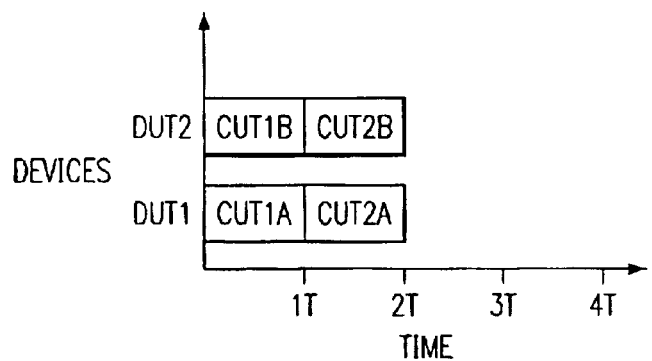
FIG. 4B shows a timing diagram of heterogeneous parallel testing using the automated test equipment of FIG. 4A.

Directing attention to FIGS. 4A and 4B, an embodiment of the present invention is shown wherein ATE 400 is adapted to provide heterogeneous test sequences for parallel testing of dice of wafer 100. As with ATE 300 of FIG. 3A, probe section 420 of ATE 400 may comprise a number of pins, and/or a configuration thereof, to provide for parallel testing of a set of dice, e.g., dice 110-1 and 110-2, and/or the different blocks thereof. However, control algorithms, e.g., operating software, of ATE 400 are adapted according to the present invention to utilize a different test sequence for ones of the dice tested in parallel. Moreover, as will be explained in further detail below, ATE 400 of the illustrated embodiment comprises switch matrices 411 and 412, which may comprise any form of circuitry for providing controllable interfacing as described herein, useful in optimizing utilization of test resources thereof.

In providing for testing of the dice of wafer 100 according to a parallel test technique of the present invention, it may be determined that the devices to be tested present certain device restrictions, such as particular circuit blocks being incompatible with simultaneous parallel testing. For example, as described above with respect to FIGS. 3A and 3B, it may be determined that the RF portions of mixed circuit blocks 111 cause mutual interference such that simultaneous parallel testing thereof is not advisable. Accordingly, control algorithms of ATE 400, or an operator thereof, may determine test sequences for the dice of wafer 100 in which mixed circuit blocks 111 are tested at different epochs, to thereby facilitate parallel testing of dice without experiencing undesired interference. Moreover, as ATE 400 is adapted to provide for heterogeneous test sequences, the aforementioned test sequences may further include testing of digital circuit blocks 112 at different epochs, although there may be no compatibility issue with respect to their simultaneous parallel testing, in order to optimize testing operation of ATE 400. Such optimization may provide for minimized total test time, maximized use of available resources, minimized number of required resources, and/or the like.

Directing attention to FIG. 4B, a timing diagram illustrating implementation of heterogeneous test sequences meeting the above criteria with respect to a set of dice to be tested in parallel including dice 110-1 and 110-2 is shown. Specifically, dice 110-1 (DUT1) and 110-2 (DUT2) may have the aforementioned heterogeneous test sequences performed to test mixed circuit block 111-1 (CUT1A) of die 110-1 while simultaneously testing digital circuit block 112-2 (CUT1B) of die 110-2. Thereafter, the heterogeneous test sequences may provide testing of digital circuit block 112-1 (CUT2A) of die 110-1 while simultaneously testing mixed circuit block 111-2 (CUT2B) of die 110-2. Subsequent sets of dice of wafer 100 may be similarly tested. Where each such CUT requires time T for testing, heterogeneous parallel testing of the illustrated set of dice of wafer 100 according to an embodiment of the present invention is accomplished in 2T time.

From the above, it should be appreciated that implementation of heterogeneous test sequences of the present invention can lead to improved total time for testing given a certain set of device restrictions. Embodiments of the present invention may, additionally or alternatively, be utilized to provide advantages with respect to resource limitations. It is not uncommon to have a limited number of test resources available with respect to a particular ATE. For example, analog and mixed signal test resources are often relatively expensive and large, thereby often dictating that only a few such resources are available at a particular ATE. The availability of such resources may be taken into account when determining heterogeneous test sequences according to an embodiment of the present invention.

Figure 4C:
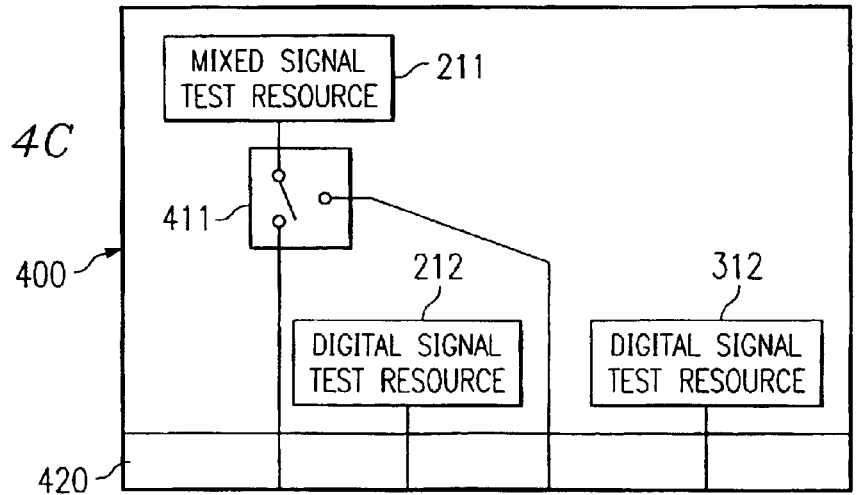
FIG. 4C shows automated test equipment for heterogeneous parallel testing according to the present invention.

Directing attention to FIG. 4C, an embodiment of the present invention is shown wherein ATE 400, having limited availability of a particular resource, is adapted to provide heterogeneous test sequences for parallel testing of dice of wafer 100. As with ATE 300 of FIG. 3C, ATE 400 of FIG. 4C includes a plurality of digital signal test resources (212 and 312), but only a single mixed signal test resource (211). Accordingly, control algorithms, e.g., operating software, of ATE 400 are adapted according to the present invention to utilize a different test sequence for ones of the dice tested in parallel using switch matrix 411.

In providing for testing of the dice of wafer 100 according to the present invention, it may be determined that a particular test resource is limited, such as having only a single mixed signal test resource at ATE 400. Accordingly, control algorithms of ATE 400, or an operator thereof, may determine test sequences for the dice of wafer 100 in which mixed circuit blocks 111 are tested at different epochs, to thereby facilitate use of the limited test resource with respect to the dice to be tested in parallel. Moreover, as ATE 400 is adapted to provide for heterogeneous test sequences, the aforementioned test sequences may further include testing of digital circuit blocks 112 at different epochs, although there may be no compatibility issue or resource limitation with respect to their simultaneous parallel testing, in order to optimize testing operation of ATE 400. Accordingly, this embodiment parallel test technique, addressing ATE test resource limitations, results in testing of the exemplary set of dice being accomplished in 2T time as illustrated in FIG. 4B.

It should be appreciated that switch matrix 411 shown in FIGS. 4A and 4C facilitates the shared use of mixed signal test resource 211 among the dice being tested in parallel. According to a preferred embodiment, control algorithms of ATE 400 provide control of switch matrix 411 to communicatively couple mixed signal test resource 211 to appropriate pins of probe section 420 and, thereby, couple mixed signal test resource 211 to selected ones of mixed signal blocks 111 during a particular epoch.

Similarly, although other test resources, such as digital signal test resource 212, may not be as limited in availability as some test resources, such as mixed signal test resource 211, switch matrices of the present invention may be utilized to facilitate their optimized use. Accordingly, ATE 400 of FIG. 4A comprises switch matrix 412 providing shared use of digital signal test resource 212 among the dice being tested in parallel. Specifically, the aforementioned illustrative heterogeneous test sequences, whether accommodating device restrictions or resource limitations, not only result in the use of mixed signal test resource 211 during different epochs in testing a set of dice in parallel but also result in the use of digital signal test resource 212 during different epochs in testing the set of dice in parallel. Accordingly, control algorithms of ATE 400 of the illustrated embodiment provide control of switch matrix 412 to communicatively couple digital signal test resource 212 to appropriate pins of probe section 420 and, thereby, couple digital signal test resource 212 to selected ones of digital signal blocks 112 during a particular epoch. Such an embodiment, in addition to providing improved testing times, also allows for the optimization of an ATE in terms of the number of resources utilized for testing a given device.

Embodiments of the present invention may utilize multiple iterations of particular test resources, in addition to or in the alternative to the aforementioned switch matrices, if desired. For example, digital signal test resources are typically inexpensive and, therefore, may be provided in plurality at an ATE. Different ones of these redundant test resources may be utilized in performing tests with respect to dice of a set of dice tested in parallel according to the present invention. Accordingly, one or more switch matrices may be omitted, or the complexity of a switch matrix or matrices may be reduced, in such a scenario by utilizing a separate redundant test resource for ones of the dice tested in parallel. Moreover, intelligent scheduling of such resources, perhaps in combination with the aforementioned switch matrices, may facilitate the parallel testing of increased numbers of dice, thereby further optimizing testing according to the present invention.

Embodiments of the present invention utilize heterogeneous test sequences to manage the results of the tests or side effects associated with the testing of dice, in addition to or in the alternative to addressing the aforementioned device restrictions and/or resource limitations. Accordingly, test resources of ATE 400 may monitor particular attributes, such as temperature, noise, cross-talk, power consumption, etcetera, during testing of dice, such as through the use of sensors disposed in probe section 420.

Performing tests with respect to particular circuit blocks may, for example, result in the generation of a relatively large amount of heat, whereas testing of other circuit blocks does not generate appreciable heat. Similarly, a common power supply may be utilized with respect to the dice being tested, thereby limiting peak power availability. The present invention may utilize information with respect to effects or results of the testing in order to configure/reconfigure heterogeneous test sequences of the present invention, such as to minimize or stabilize heating of the wafer, to minimize or stabilize peak power requirements, and/or the like.

Control algorithms of ATE 400 may use the information with respect to such effects or results to dynamically determine the sequence of tests for the dice of a set of dice being tested in parallel to address various side effects. For example, undesired heating of a wafer during multi-site testing according to the present invention may be reduced by implementing heterogeneous test sequences which mix testing of circuit blocks which generate high heat on some dice with testing of circuit blocks which generate less heat on the remaining dice of a set of dice being tested in parallel. Such dynamic configuration/reconfiguration may be made with respect to the set of dice then being tested and/or implemented with respect to subsequent sets of dice tested in parallel. Accordingly, ATEs of the present invention may provide a testing solution which evolves to provide optimized test sequences.

Similarly, control algorithms of ATE 400 may utilize diagnostic or other information with respect to the operation and/or availability of various test resources in order to configure/reconfigure heterogeneous test sequences of the present invention. For example, ATE control algorithms may determine that a particular redundant test resource has failed or is providing anomalous results, thereby suggesting that the test resource should not be utilized in testing operations until further diagnosis and repairs are performed. Accordingly, the present invention may utilize information with respect to such resource operations in order to dynamically configure/reconfigure heterogeneous test sequences of the present invention to perform desired testing using the remaining available test resources.

Figure 5:
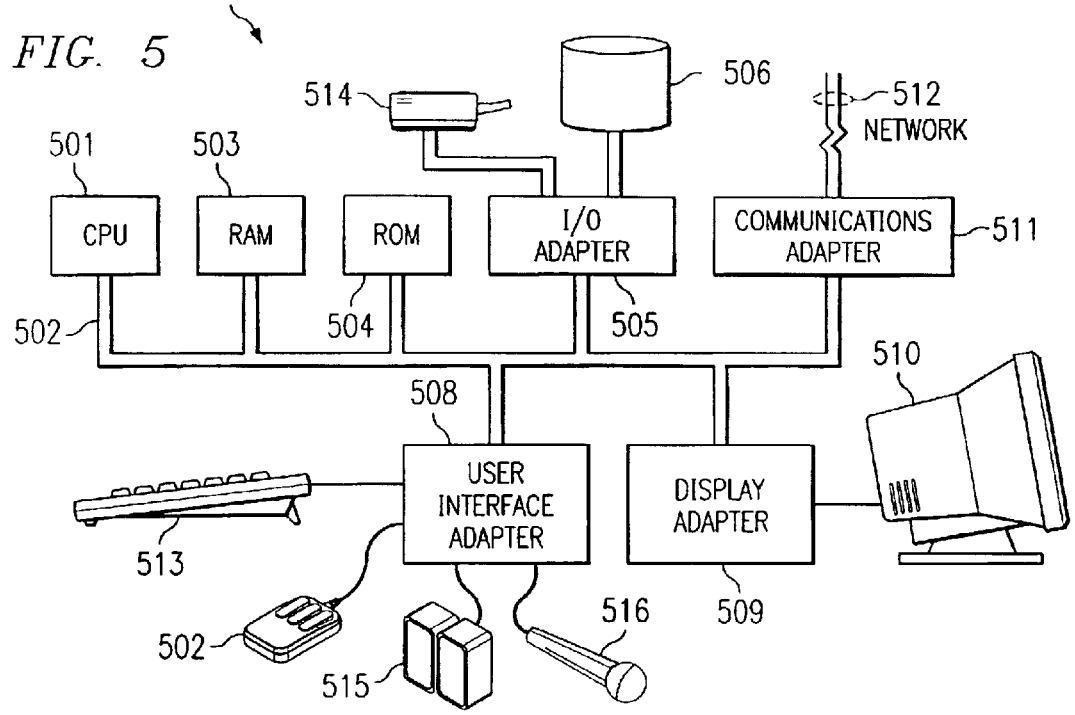
FIG. 5 shows detail with respect to an embodiment of a system useful with the automated test equipment of FIG. 4A.

FIG. 5 illustrates an example computer system useful with a tester (e.g., ATE 400) which is adapted to implement embodiments of the present invention. For example, computer system 500 may be utilized for generating a test plan, e.g., scheduling tests to optimize the use of ATE resources and/or to avoid interference or other undesired effects of parallel testing, etcetera. Once a test plan is generated by computer system 500, control code may be downloaded to an appropriate tester (e.g., ATE 400) for implementation according to the present invention. Central processing unit (CPU) 501 is coupled to system bus 502. CPU 501 may be any general purpose CPU. Suitable processors include without limitation INTEL's PENTIUM® 4 processor, for example. However, the present invention is not restricted by the architecture of CPU 501 as long as CPU 501 supports the inventive operations as described herein. CPU 501 may execute the various logical instructions according to embodiments of the present invention.

Computer system 500 also preferably includes random access memory (RAM) 503, which may be SRAM, DRAM, SDRAM, or the like. Computer system 500 may, for example, utilize RAM 503 to store (at least temporarily) various signals generated from a DUT for comparison with expected signatures. Computer system 500 preferably includes read-only memory (ROM) 504 which may be PROM, EPROM, EEPROM, or the like. RAM 503 and ROM 504 hold user and system data and programs as is well known in the art.

Computer system 500 also preferably includes input/output (I/O) adapter 505, communications adapter 511, user interface adapter 508, and display adapter 509. I/O adapter 505 and/or user interface adapter 508 may, in certain embodiments, enable a user to interact with computer system 500 in order to input information (e.g., for triggering a test of a DUT, specifying a test for a DUT, configuring a heterogeneous test sequence, and/or the like).

I/O adapter 505 may be coupled to a printer 514 to enable information about a test (e.g., test results) to be printed thereon. Further, I/O adapter 505 preferably connects to storage device(s) 506, such as one or more of hard drive, compact disc (CD) drive, floppy disk drive, tape drive, etc. to computer system 500. The storage devices may be utilized when RAM 503 is insufficient for the memory requirements associated with implementing a test.

Communications adapter 511 may be included, which is adapted to couple computer system 500 to network 512, which may be any suitable communications network, such as a telephony network (e.g., public or private switched telephony network), local area network (LAN), the Internet or other wide area network (WAN), and/or wireless network. Communications adapter 511 may be utilized to place computer system 500 in communication with a tester, such as ATE 400, to provide control instructions thereto. Of course, other means for communicating information between computer system 500 and an associated tester may be utilized, such as manual transfer by media such as diskette, wireless communication, fiber optics, and the like. User interface adapter 508 couples user input devices, such as keyboard 513, pointing device 507, and/or other input/output devices, such as audio speaker(s) 515 and microphone 516, to computer system 500. Display adapter 509 is driven by CPU 501 to control the display on display device 510 to, for example, display information to a user about a device test being conducted.

Figure 6:
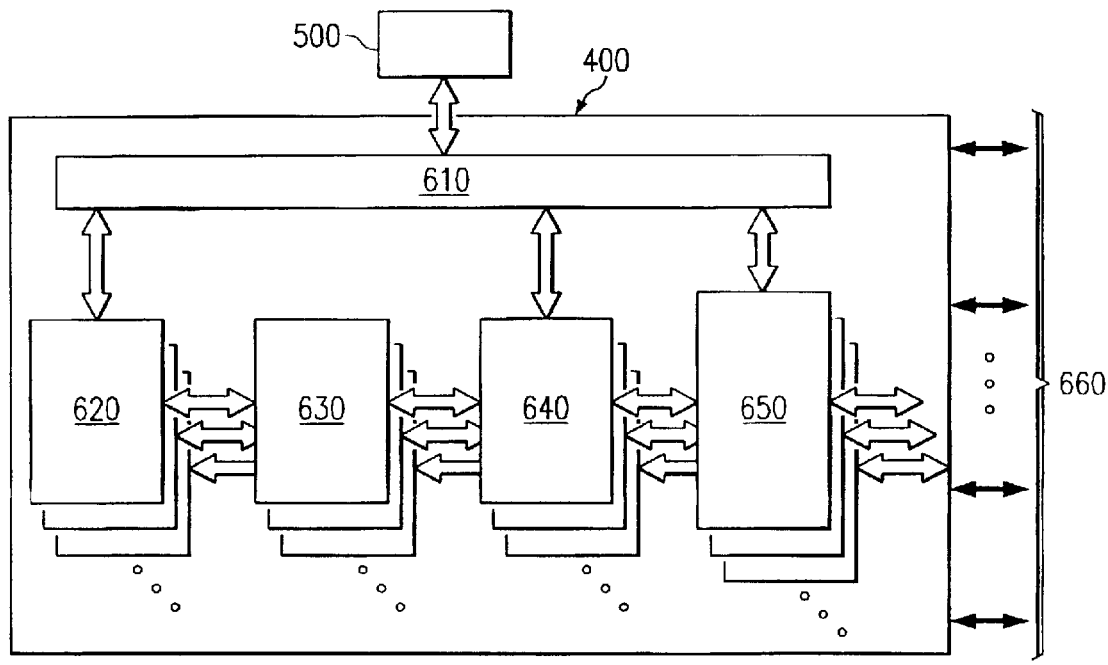
FIG. 6 shows detail with respect to an embodiment of the automated test equipment of FIG. 4A.

FIG. 6 illustrates an exemplary tester, ATE 400, which is adapted to implement embodiments of the present invention. In the embodiment of FIG. 6, computer system 500 is shown coupled to ATE 400, such as via communications adapter 511 of FIG. 5, and may provide down load of test plans, test data, and/or other interfacing functionality with respect to ATE 400. Such test plans and test data may be loaded into ATE memory (e.g., program and/or vector memory of test resources 620) via access control logic 610. Test resources 620 may comprise the aforementioned digital, analog, and/or mixed test resources. In the illustrated embodiment, test resources 620 are coupled to controller/sequencers 640 via interconnection network 630. Controller/sequencers 640 preferably operate to couple ones of the test resources 620 to ones of pins 660 (such as may be disposed upon a probe or probes) to apply appropriate test data to the DUTs at the times and sequences set forth in the aforementioned test plans. Pin electronics cards 650 are disposed between controller/sequencers 640 and pins 660 of the illustrated embodiment to provide the particular voltage levels required by the DUTs.

It should be appreciated that, although the illustrated embodiment shows three test resources, controller/sequencers, and pin electronics cards, ATE 400 may comprise any number of items. Moreover, there is no limitation that a same number of each such items be provided according to the present invention.

Although preferred embodiments of the present invention have been described above with reference to dice parallel test sets comprising 2 dice, 2 circuit blocks, and 2 ATE resources, it should be appreciated that the present invention is not limited to parallel testing of any particular number of dice or circuit blocks nor is the present invention limited to use of 2 ATE resources. Sets of dice, and the number of dice therein, to be tested in parallel using heterogeneous test sequences of the present invention may be determined through reference to the test resources available at the ATE, the pins and pin configurations available at the probe, the compatibility of the DUTs and/or CUTs to be tested in parallel (e.g., mutual interfering noise, generation of heat, isolation from other circuitry, etcetera), and/or the like, and may comprise any number of DUTs and/or CUTs.

In generalizing the application of the present invention to sets of different numbers of dice, it should be appreciated that improvement with respect to optimizing testing of dice may be experienced for all numbers of dice tested in parallel (N) where the test time required to apply tests to a device which does not allow shared resources (t-non-shared) is smaller than the test time required to apply tests to a device which does allow shared resources (t-shared). Moreover, for a give value of t-shared and t-non-shared for a device, the benefit of the present invention increases by increasing the dice tested in parallel (N). Alternatively, for a given value of t-shared and t-non-shared for a device the number of instances of the shared resource (R) that are available may be reduced, such as to provide less expensive equipment, without impacting total test time.

It should be appreciated that, although embodiments of the present invention have been described above wherein heterogeneous test sequences for a set of dice to be tested in parallel each comprise a different order of tests, embodiments of the present invention may employ heterogeneous test sequences in which a same test sequence is utilized with respect to a plurality of the dice being tested in parallel. For example, it may be determined that particular dice, due to their proximity upon the wafer, should not have a test with respect to a particular circuit block tested in parallel simultaneously. However, other ones of the dice, due to their physical placement upon the wafer, may allow such simultaneous parallel testing of that particular circuit block. Accordingly, an embodiment of the present invention might utilize two heterogeneous test sequences, substantially as discussed above, to test 4 DUTs in parallel, such that the first and second heterogeneous test sequence are applied to alternate ones of the dice being tested. For example, a first DUT may utilize the first heterogeneous test sequence, a second DUT disposed on the wafer next to the first DUT may utilize the second heterogeneous test sequence, a third DUT disposed on the wafer next to the second DUT may utilize the first heterogeneous test sequence, and a fourth DUT disposed on the wafer next to the third DUT may utilize the second heterogeneous test sequence.

It should be appreciated that, although embodiments of the present invention have been described herein with reference to testing dice of a wafer, the concepts of the present invention are applicable to testing with respect to a variety of integrated circuitry. For example, ATEs implementing heterogeneous test sequences of the present invention may be utilized in testing package testing, if desired.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system for testing dice on a wafer, said system comprising:
    automated test equipment having a plurality of test resources, wherein ones of said test resources perform different circuitry tests including a first circuitry test and a second circuitry test; and
    a probe for placing said plurality of test resources in communication with a set of dice comprising a plurality of dice on said wafer, wherein control circuitry of said automated test equipment performs said first and second circuitry tests in a different order with respect to a first die and a second die of said set of dice.

2. The system of claim 1, wherein testing of said first die and said second die is performed concurrently using said different order of performing said first and second circuitry tests.

3. The system of claim 1, wherein said different order of said first and second circuitry tests is selected at least in part based upon a restriction with respect to simultaneous testing of said first and second die.

4. The system of claim 1, wherein said different order of said first and second circuitry tests is selected at least in part based upon a limitation with respect to a test resource of said plurality of test resources.

5. The system of claim 1, wherein said different order of said first and second circuitry tests is selected at least in part based upon an effect of testing of said first and second dice.

6. The system of claim 5, wherein said effect comprises a temperature.

7. The system of claim 5, wherein said effect comprises power consumption.

8. The system of claim 1, wherein said different order of said first and second circuitry tests is selected dynamically during testing of said dice on said wafer.

9. The system of claim 8, further comprising:

a sensor for monitoring an effect of testing of said first and second dice, wherein said dynamic selection of said different order of said first and second circuitry tests is based at least in part upon information provided by said sensor.

10. The system of claim 1, wherein said plurality of test resources comprises more than 2 test resources providing different types of tests.

11. The system of claim 1, wherein said set of dice comprises more than 2 dice of said plurality of dice.

12. The system of claim 1, wherein said first and second dice comprise circuitry in addition to circuitry associated with said first and second circuitry tests.

13. A method for testing blocks of circuitry on a wafer, said method comprising:

establishing heterogeneous test sequences for use in testing said blocks of circuitry; and testing a plurality of said blocks of circuitry in parallel using said heterogeneous test sequences.

14. The method of claim 13, wherein said establishing heterogeneous test sequences comprises:

selecting an order of testing said blocks of circuitry based at least in part upon testing restrictions associated with said blocks tested in parallel.

15. The method of claim 13, wherein said establishing heterogeneous test sequences comprises:

selecting an order of testing said blocks of circuitry based at least in part upon limitations associated with test resources of an automated test equipment utilized in performing said testing.

16. The method of claim 13, wherein said establishing heterogeneous test sequences comprises:

selecting an order of testing said blocks of circuitry based at least in part upon an effect associated with said testing.

17. The method of claim 13, further comprising:

dynamically reconfiguring said heterogeneous test sequences after testing of said blocks of circuitry on said wafer has commenced.

18. The method of claim 17, wherein said reconfiguring said heterogeneous test sequences is based at least in part upon monitored attributes of said testing of said blocks of circuitry on said wafer.

19. The method of claim 18, wherein said testing said plurality of said blocks of circuitry in parallel comprises:

monitoring operational attributes of said plurality of blocks in addition to those being tested, wherein said reconfiguring said heterogeneous test sequence is based at least in part upon said monitored operational attributes.

20. The method of claim 13, wherein said establishing heterogeneous test sequences comprises:

optimizing a total time for testing said blocks of circuitry.

21. The method of claim 13, wherein said establishing heterogeneous test sequences comprises:

optimizing a number of test resources utilized in testing said blocks of circuitry.

22. A method for testing dice on a wafer, said method comprising:

establishing a first test sequence for testing circuit blocks of a first die on said wafer;

establishing a second test sequence for testing circuit blocks of a second die on said wafer, wherein said first test sequence provides for testing of circuit blocks in a different order than does said second test sequence; and testing said first die using said first test sequence while testing said second die using said second test sequence.

23. The method of claim 13, wherein said first die and said second die comprise a same set of circuit blocks.

24. The method of claim 13, further comprising:

dynamically reestablishing at least one of said first test sequence and said second test sequence.

* * * * *